United States Patent
Kang et al.

(10) Patent No.: US 6,845,030 B2
(45) Date of Patent: Jan. 18, 2005

(54) NONVOLATILE FERROELECTRIC MEMORY DEVICE AND METHOD OF FABRICATING THE SAME

(75) Inventors: Hee Bok Kang, Daejon-shi (KR); Hun Woo Kye, Kyonggi-do (KR); Geun Il Lee, Kyonggi-do (KR); Je Hoon Park, Kyonggi-do (KR); Jung Hwan Kim, Seoul (KR)

(73) Assignee: Hynix Semiconductor Inc., Ichon-shi (KR)

( * ) Notice: Subject to any disclaimer, the term of this patent is extended or adjusted under 35 U.S.C. 154(b) by 98 days.

(21) Appl. No.: 10/308,098

(22) Filed: Dec. 3, 2002

(65) Prior Publication Data
US 2003/0123272 A1 Jul. 3, 2003

(30) Foreign Application Priority Data
Dec. 29, 2001 (KR) .................................... P2001-87943

(51) Int. Cl.[7] ............................ G11C 11/22; G11C 8/00
(52) U.S. Cl. .................................... 365/145; 365/230.03
(58) Field of Search ............................... 365/63, 230.03, 365/65, 145

(56) References Cited

U.S. PATENT DOCUMENTS

| | | | |
|---|---|---|---|
| 6,028,813 A | * | 2/2000 | Choi ..................... 365/230.04 |
| 6,072,711 A | | 6/2000 | Kang |
| 6,091,622 A | | 7/2000 | Kang |
| 6,091,623 A | | 7/2000 | Kang |
| 6,118,687 A | | 9/2000 | Kang |
| 6,118,695 A | | 9/2000 | Yoneyama |
| 6,128,213 A | | 10/2000 | Kang |
| 6,324,090 B1 | * | 11/2001 | Kang ......................... 365/143 |
| 6,532,163 B2 | * | 3/2003 | Okazawa ..................... 365/97 |
| 6,594,174 B2 | * | 7/2003 | Choi et al. .................. 365/145 |

FOREIGN PATENT DOCUMENTS

| JP | 11-306766 | 11/1999 |
|---|---|---|
| JP | 11-353882 | 12/1999 |

* cited by examiner

Primary Examiner—Thong Q. Le
(74) Attorney, Agent, or Firm—Piper Rudnick LLP

(57) ABSTRACT

A nonvolatile ferroelectric memory device includes a plurality of top array blocks disposed along a first direction, each having a plurality of top sub-cell array blocks disposed along a second direction perpendicular to the first direction, each of the top sub-cell array blocks include a first plurality of unit cells, a plurality of bottom array blocks disposed along the first direction below the plurality of top array blocks, each having a plurality of bottom sub-cell array blocks disposed along the second direction, each of the bottom sub-cell array blocks include a second plurality of unit cells, a plurality of sub-bit lines extending along the second direction and disposed at equal first intervals along the first direction, each sub-bit line connected to at least a first end of one of the first and second pluralities of unit cells, and a plurality of main bit lines extending along the second direction and disposed at the equal first intervals along a third direction perpendicular to both the first and second directions.

25 Claims, 11 Drawing Sheets

NONVOLATILE FERROELECTRIC MEMORY DEVICE AND METHOD OF FABRICATING THE SAME

The present invention claims the benefit of Korean Patent Application No. P2001-87943 filed in Korea on Dec. 29, 2001, which is hereby incorporated by reference.

BACKGROUND OF THE INVENTION

1. Field of the Invention

The present invention relates to a semiconductor memory device, and more particularly, to a nonvolatile ferroelectric memory device and a method of fabricating a nonvolatile ferroelectric memory device.

2. Discussion of the Related Art

In general, a nonvolatile ferroelectric memory, i.e., a ferroelectric random access memory (FRAM), has a data processing speed equal to a dynamic random access memory (DRAM) and retains data when power is turned OFF. The FRAM and DRAM memories have similar structures, but the FRAM includes a ferroelectric capacitor having a high residual polarization characteristic. The residual polarization characteristic permits retention of data when an applied electric field is removed.

FIG. 1 is a diagram showing a hysteresis loop of a ferroelectric material according to the related art. In FIG. 1, an amount of polarization within a ferroelectric material is induced when an electric field is applied to the ferroelectric material. However, an amount of residual (remnant) polarization remains when the electric field is removed from the ferroelectric material. Accordingly, an amount of electric charge may be maintained within the ferroelectric material, i.e., at "a" and "d" states, when the electric field is removed. Thus, data may be stored in the ferroelectric material without being erased due to the residual polarization (or spontaneous polarization) of the ferroelectric material. A nonvolatile ferroelectric memory cell is used as a memory device by correlating the "d" and "a" states to a logical "1" and "0," respectively.

FIG. 2 is a schematic diagram of a unit cell of a nonvolatile ferroelectric memory device according to the related art. In FIG. 2, a nonvolatile ferroelectric memory device includes a bitline B/L formed along a first direction, a wordline W/L formed along a second direction perpendicular to the first direction to cross the bitline B/L, a plate line P/L spaced apart from the wordline W/L along the second direction, a transistor T1 having a gate connected to the wordline W/L and a source connected to the bitline B/L, and a ferroelectric capacitor FC1. A first terminal of the ferroelectric capacitor FC1 is connected to a drain of the transistor T1 and a second terminal of the ferroelectric capacitor FC1 is connected to the plate line P/L.

FIG. 3A is a timing diagram showing a write mode operation of a nonvolatile ferroelectric memory device according to the related art, and FIG. 3B is a timing diagram showing a read mode operation of a nonvolatile ferroelectric memory device according to the related art.

In FIG. 3A, during the write mode, an externally applied chip enable signal CSBpad is enabled from a HIGH state to a LOW state. At the same time, if a write enable signal WEBpad is applied from a HIGH state to a LOW state, the write mode starts. Subsequently, if address decoding in the write mode starts, a pulse applied to a corresponding wordline is transited from a LOW state to a HIGH state to select a cell.

A HIGH signal in a certain period and a LOW signal in a certain period are sequentially applied to a corresponding plate line P/L in a period where the wordline W/L is maintained at HIGH state. To write a logic value "1" or "0" in the selected cell, a HIGH signal or a LOW signal synchronized with the write enable signal WEBpad is applied to a corresponding bitline B/L. Accordingly, a HIGH signal is applied to the bitline B/L, and if the LOW signal is applied to the plate line P/L in a period where the signal applied to the wordline W/L is HIGH, a logic value "1" is written to the ferroelectric capacitor. A LOW signal is applied to the bitline B/L, and if the signal applied to the plate line P/L is HIGH, a logic value "0" is written to the ferroelectric capacitor.

In FIG. 3B, if an externally applied chip enable signal CSBpad is enabled from a HIGH state to a LOW state, all bitlines B/L become equipotential to a low voltage by an equalizer signal EQ before a corresponding wordline W/L is selected. Then, the respective bitline B/L becomes disabled and an address is decoded, and the LOW signal is transited to the HIGH signal in the corresponding wordline W/L according to the decoded address so that a corresponding cell is selected. The HIGH signal is applied to the plate line P/L of the selected cell to remove data corresponding to the logic value "1" stored in the ferroelectric memory. If the logic value "0" is stored in the ferroelectric memory, corresponding data is not removed.

The removed data and the data that is not removed are output as different values by the ferroelectric hysteresis loop, so that a sensing amplifier senses the logic value "1" or "0". Accordingly, if the data is removed, the "d" state is transited to an "f" state as shown in the hysteresis loop of FIG. 1, and if the data is not removed, the "a" state is transited to the "f" state. Thus, if the sensing amplifier is enabled after a set time has elapsed, the logic value "1" is output in case that the data is removed while the logic value "0" is output in case that the data is not removed. After the sensing amplifier outputs data, to recover the data to the original data, the plate line P/L becomes disabled from a HIGH state to a LOW state where the HIGH signal is applied to the corresponding wordline W/L.

However, the nonvolatile ferroelectric memory device according to the related art is problematic. For example, when the semiconductor chip is highly integrated, a distance between intervals of adjacent bit lines decreases and cross-talk capacitance between the adjacent bit lines increases, thereby decreasing a sensing margin. Accordingly, there are limits for increasing the intervals between adjacent bit lines and increasing the sensing margin.

SUMMARY OF THE INVENTION

Accordingly, the present invention is directed to a nonvolatile ferroelectric memory device and a method of fabricating a nonvolatile ferroelectric memory device that substantially obviates one or more problems due to limitations and disadvantages of the related art.

An object of the present invention is to provide a nonvolatile ferroelectric memory device and a method of fabricating a nonvolatile ferroelectric memory device that reduces a rate of cross-talk capacitance between adjacent bit lines by alignment of main bit lines having regular intervals on a plurality of layers.

Another object of the present invention is to provide a nonvolatile ferroelectric memory device and a method of fabricating a nonvolatile ferroelectric memory device that increases production yield by reducing particle contamination between main bit lines during fabrication processes.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the invention, as embodied and broadly described, a nonvolatile ferroelectric memory device includes a plurality of top array blocks disposed along a first direction, each having a plurality of top sub-cell array blocks disposed along a second direction perpendicular to the first direction, each of the top sub-cell array blocks include a first plurality of unit cells; a plurality of bottom array blocks disposed along the first direction below the plurality of top array blocks, each having a plurality of bottom sub-cell array blocks disposed along the second direction, each of the bottom sub-cell array blocks include a second plurality of unit cells, a plurality of sub-bit lines extending along the second direction and disposed at equal first intervals along the first direction, each sub-bit line connected to at least a first end of one of the first and second pluralities of unit cells, and a plurality of main bit lines extending along the second direction and disposed at the equal first intervals along a third direction perpendicular to both the first and second directions.

In another aspect, a method of fabricating a nonvolatile ferroelectric memory device includes steps of forming a plurality of top array blocks disposed along a first direction, each having a plurality of top sub-cell array blocks disposed along a second direction perpendicular to the first direction, each of the top sub-cell array blocks include a first plurality of unit cells, forming a plurality of bottom array blocks disposed along the first direction below the plurality of top array blocks, each having a plurality of bottom sub-cell array blocks disposed along the second direction, each of the bottom sub-cell array blocks include a second plurality of unit cells, forming a plurality of sub-bit lines extending along the second direction and disposed at equal first intervals along the first direction, each sub-bit line connected to at least a first end of one of the first and second pluralities of unit cells, and forming a plurality of main bit lines extending along the second direction and disposed at the equal first intervals along a third direction perpendicular to both the first and second directions.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings.

Figure 1:
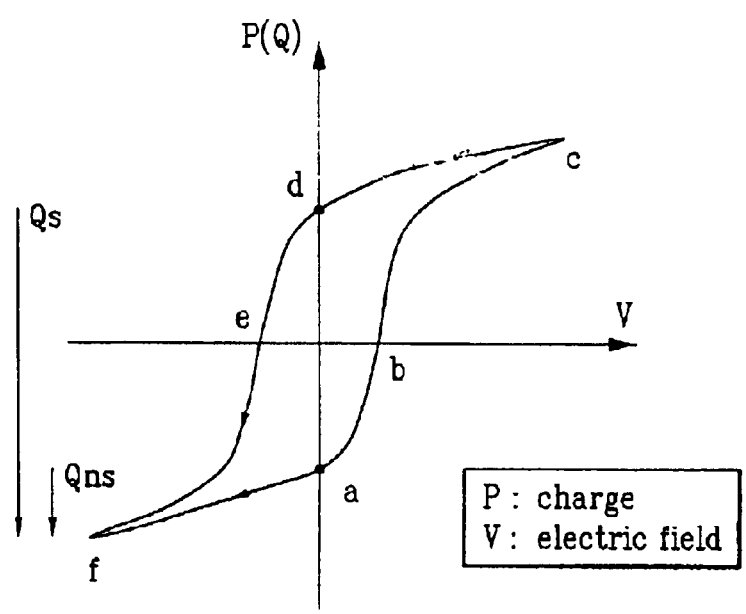
FIG. 1 is a diagram showing a hysteresis loop of a ferroelectric material according to the related art.
Figure 2:
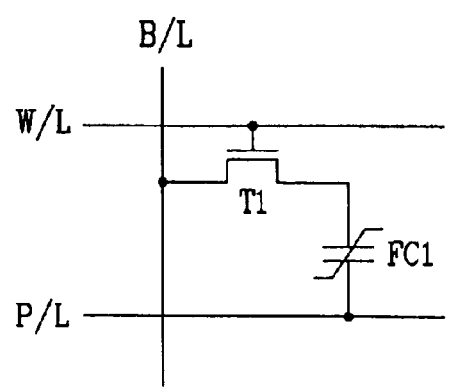
FIG. 2 is a schematic diagram of a unit cell of a nonvolatile ferroelectric memory device according to the related art.
Figure 3A:
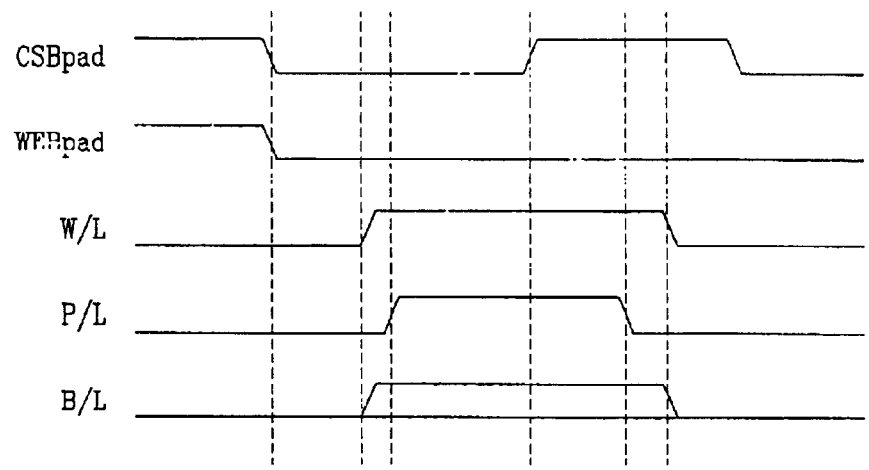
FIG. 3A is a timing diagram showing a write mode operation of a nonvolatile ferroelectric memory device according to the related art.
Figure 3B:
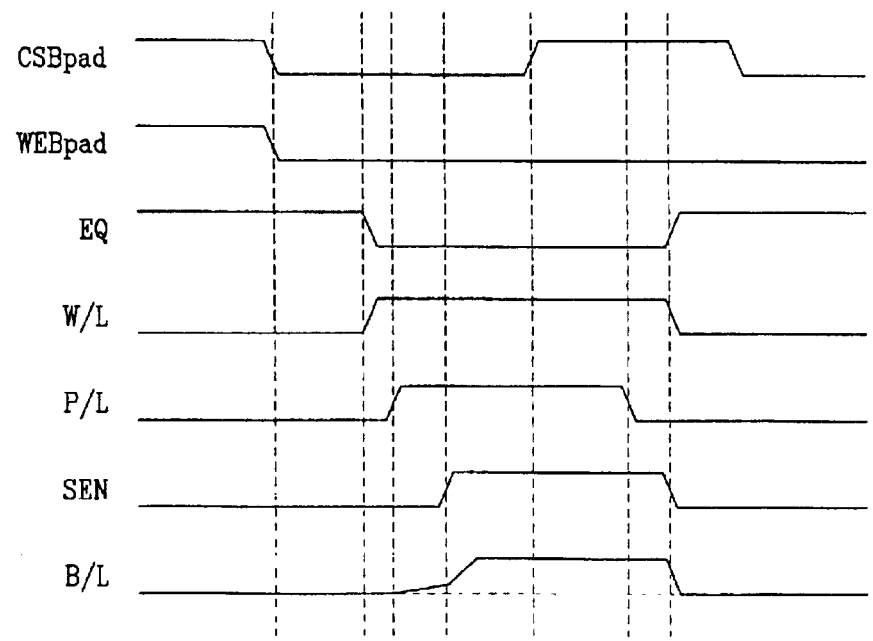
FIG. 3B is a timing diagram showing a read mode operation of a nonvolatile ferroelectric memory device according to the related art.
Figure 4:
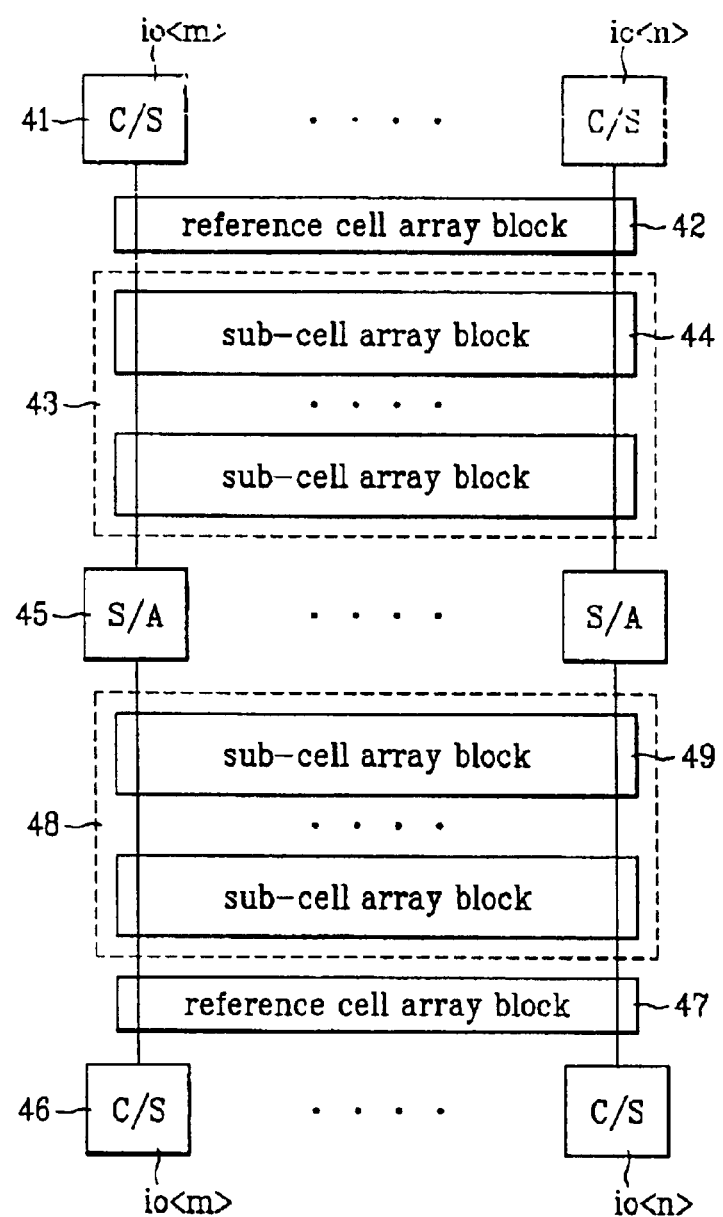
FIG. 4 is a block diagram showing an exemplary ferroelectric cell array according to the present invention.

FIG. 4 is a block diagram showing an exemplary ferroelectric cell array according to the present invention. In FIG. 4, a memory cell may include a cell array having top and bottom cell array blocks 43 and 48 arranged along a first direction, sense amplifiers 45 connected to each bit line at a central location between the top and bottom array blocks 43 and 48, reference cell array blocks 42 and 47, and column switch blocks 41 and 46 connected to data buses io<m>, . . . , io<n> extending along the first direction that may be connected to a main amplifier (not shown). The top and bottom cell array blocks 43 and 48 may include a plurality of sub-cell array blocks 44 and 49, respectively. The reference cell array block 42 may be constructed between the top cell array block 43 and the column switch block 41 corresponding to the top cell array block 43, and the reference cell array block 47 may be constructed between the bottom cell array block 48 and the column switch block 46 corresponding to the bottom cell array block 48.

Figure 5:
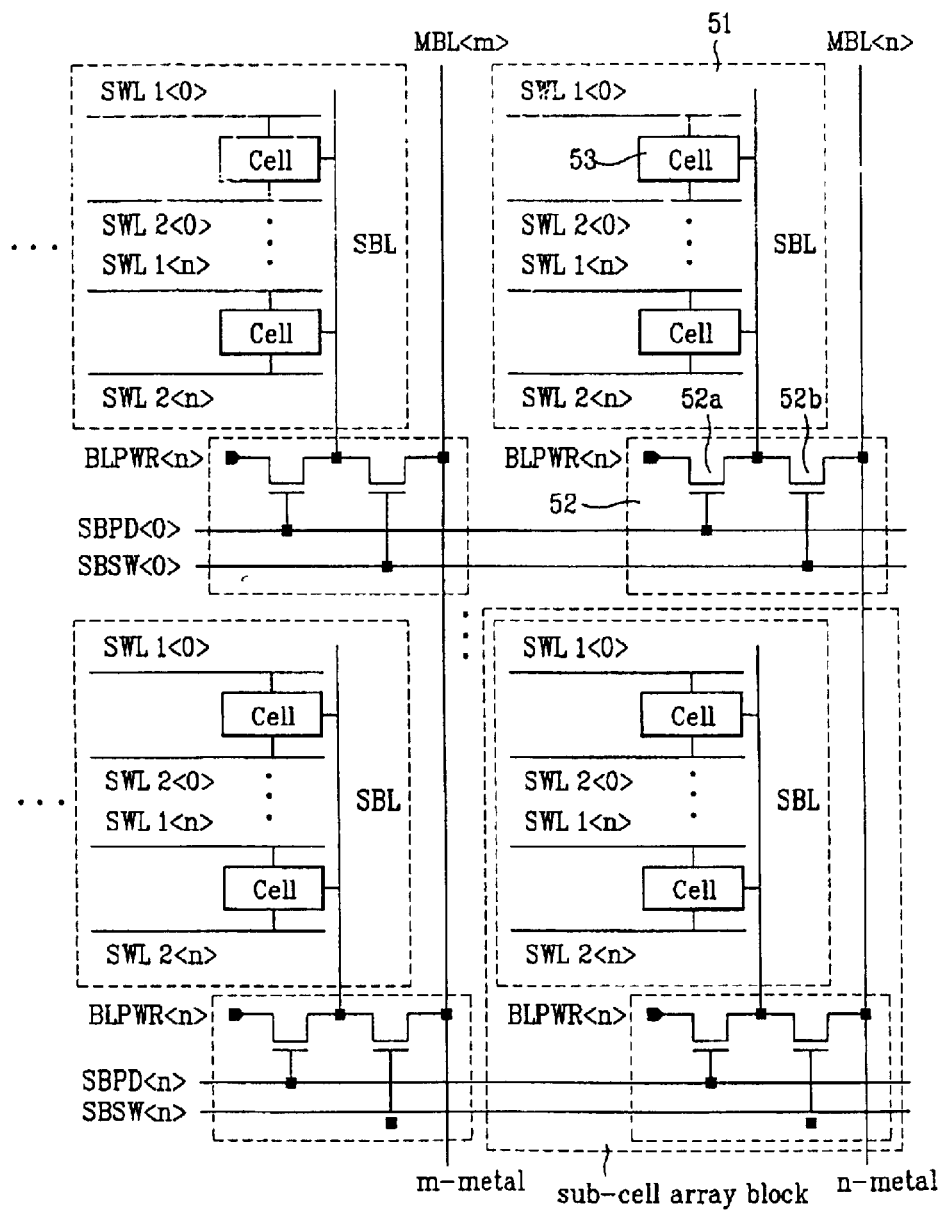
FIG. 5 is a schematic layout showing an exemplary ferroelectric split cell array according to the present invention.

FIG. 5 is a schematic layout showing an exemplary ferroelectric split cell array according to the present invention. In FIG. 5, a cell array block may include a plurality of sub-cell array blocks each having a plurality of main bit lines MBL formed of metal extending along a first direction, a plurality of sub-bit lines SBL extending along the first direction parallel to the main bit lines MBL to correspond to each of a sub-cell array 51, a plurality of split word line pairs SWL1 and SWL2 disposed within each sub-cell array 51 extending along a second direction perpendicular to the main bit lines MBL and sub-bit lines SBL, a plurality of supply lines SBPD and SBSW extending along the second direction and disposed along each sub-cell array 51, and a plurality of switching control blocks 52 disposed between each of the supply lines SBPD and SBSW and each sub-cell array 51 for switching SBPD and SBSW signals.

Accordingly, each of the switching control blocks 52 include first and second serially-connected transistors 52a and 52b, wherein a gate of the first transistor 52a may be connected to the SBPD supply line and source/drain of the first transistor 52a may be connected to a terminal of BLPWR that controls power supplied to the sub-bit lines SBL. A gate of the second switching transistor 52b may be connected to the SBSW supply line, and a source/drain of the second switching transistor 52b may be connected to the main bit line MBL. Thus, an output of the first and second transistors 52a and 52b may be connected the sub-bit line SBL, and each main bit line MBL may be selectively connected to one of the sub-bit lines SBL. Accordingly, the signals transmitted by the main bit lines MBL may transition to a signal level of a corresponding sub-bit line SBL. Moreover, when the signal of the sub-bit line SBL is transitioned to enable the SBPD supply line, the signal level of the sub-bit line SBL may be adjusted to the signal level of ground potential or of a HIGH level.

Figure 6:
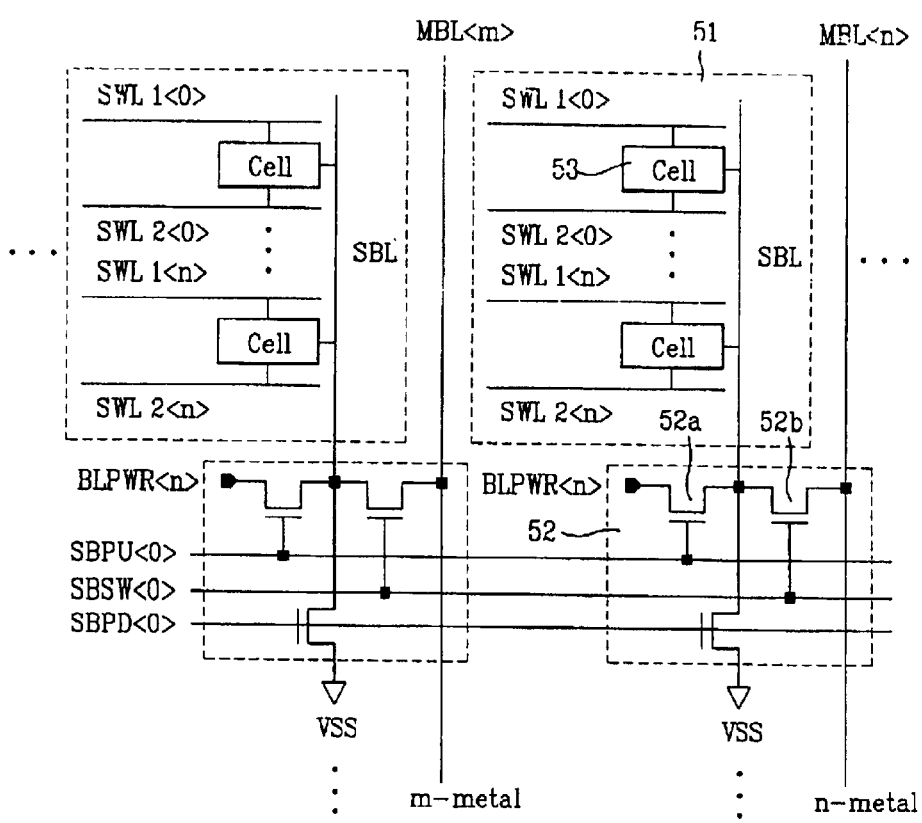
FIG. 6 is a schematic layout showing another exemplary ferroelectric split cell array according to the present invention.

FIG. 6 is a schematic layout showing another exemplary ferroelectric split cell array according to the present invention. In FIG. 6, the SBPU supply line and a third switching transistor may be added to the switching control block 52 (of FIG. 5), the SBPD supply line (of FIG. 5) may be changed to a SBPU supply line, a gate of the third switching transistor may connect the sub-bit line SBL to a ground potential VSS via the SBPD supply line and source/drain of the third transistor.

Figure 7:
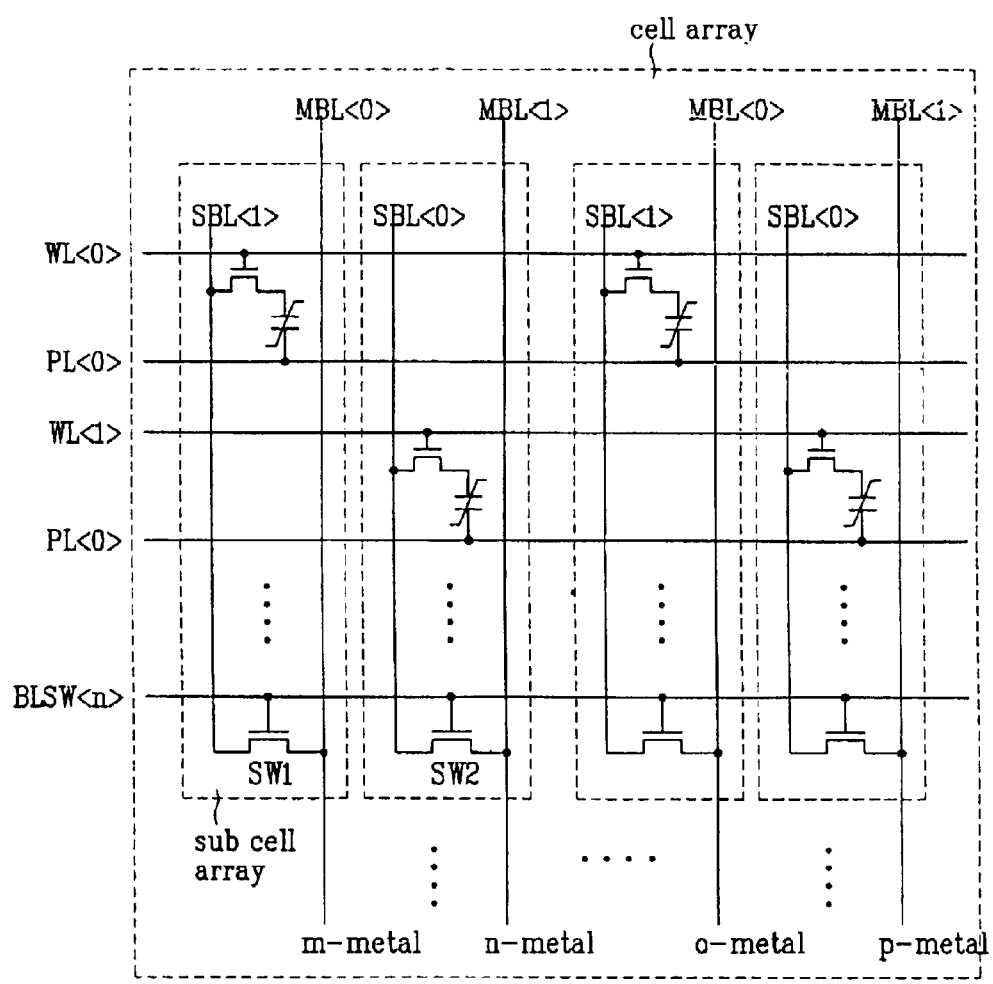
FIG. 7 is a schematic layout showing another exemplary ferroelectric cell array according to the present invention.

FIG. 7 is a schematic layout showing another exemplary ferroelectric cell array according to the present invention. In FIG. 7, a plurality of sub-cell array blocks each may include a plurality of memory cells disposed in a matrix along row and column directions, a plurality of word lines WL, a plurality of plate lines PL, and a plurality of main bit lines MBL formed of metal extending along the column direction to cross the pairs word lines WL and plate lines PL. The memory cells for each row may be arranged per two columns, and the memory cells for each column may be arranged per two rows. Accordingly, when a pair of word and plate lines WL and PL is enabled, only the memory cells connected to odd-numbered sub-bit lines SBL or even-numbered sub-bit lines SBL are selected. Thus, the cell array is considered a folded bit line cell array, wherein each memory cell will not overlap when the memory cell arrays are folded along an axis of the main bit line MBL. The unit memory cells may be disposed between pairs of the word and plate lines WL and PL and the sub-bit lines SBL, and switching elements SW may be disposed at ends of the sub-bit lines SBL to control electrical interconnection of the sub-bit lines SBL and corresponding ones of the main bit lines MBL. Each of the memory unit cells may include a transistor and a ferroelectric capacitor, wherein a gate of the transistor may be connected to a corresponding one of the word lines WL and a first electrode of the ferroelectric capacitor may be connected to one of a drain/source of the transistor and a second electrode of the ferroelectric capacitor may be connected to a corresponding one of the plate lines PL.

Figure 8:
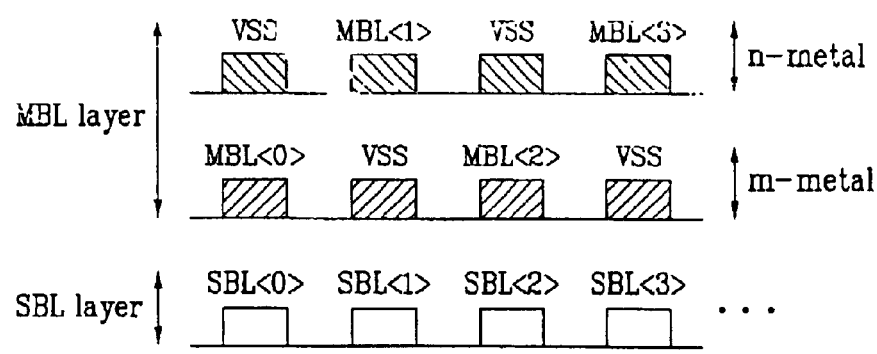
FIG. 8 is a cross-sectional view of an exemplary metal line of a nonvolatile ferroelectric memory according to the present invention.

FIG. 8 is a cross-sectional view of an exemplary metal line of a nonvolatile ferroelectric memory according to the present invention. In FIG. 8, an MBL layer that includes of a plurality of main bit lines MBL may be disposed adjacent to a SBL layer that includes a plurality of sub-bit lines, wherein the MBL layer may be arranged along a first layer (m-metal) and a second layer (n-metal). The first layer (m-metal layer) may include a plurality of even-numbered main bit lines MBL<0>, MBL<2>, ..., MBL<m> extending along a first direction and a first plurality of potential lines VSS extending along the first direction, wherein the plurality of even-numbered main bit lines MBL<0>, MBL<2>, ..., MBL<m> and the first plurality of potential lines VSS are disposed at equal first intervals along a first direction. The second layer (n-metal layer) may include a plurality of odd-numbered main bit lines MBL<1>, MBL<3>, ..., MBL<n> extending along the first direction and a second plurality of potential lines VSS extending along the first direction, wherein the plurality of odd-numbered main bit lines MBL<1>, MBL<3>, ..., MBL<n> and the second plurality of potential lines VSS are disposed at the equal first intervals along the first direction. The plurality of even-numbered main bit lines MBL<0>, MBL<2>, ..., MBL<m> may be disposed adjacent to the SBL layer having the plurality of sub-bit lines SBL<0>, SBL<1>, ..., SBL<n>. The SBL layer may be divided into even-numbered sub-bit lines SBL<0>, SBL<2>, ..., SBL<n+1>, and odd-numbered sub-bit lines SBL<1>, SBL<3>, ..., SBL<n>. Thus, even-numbered ones of the main bit lines MBL<0>, MBL<2>, ..., MBL<m> may directly overlie even-numbered ones of the sub-bit lines SBL<0>, SBL<2>, ..., SBL<m>, and odd-numbered ones of the main bit lines MBL<1>, MBL<3>, ..., MBL<n> may directly overlie odd-numbered ones of the sub-bit lines SBL<1>, SBL<3>, ..., SBL<n>. Moreover, the even-numbered ones of the main bit lines MBL<0>, MBL<2>, ..., MBL<m>, the odd-numbered ones of the main bit lines MBL<1>, MBL<3>, ..., MBL<n>, the even-numbered ones of the sub-bit lines SBL<0>, SBL<2>, ..., SBL<m>, and the odd-numbered ones of the sub-bit lines SBL<1>, SBL<3>, ..., SBL<n> may be disposed at an equal third interval along a third direction perpendicular to the first and second directions. Accordingly, interference is prevented by using a shield effect between main bit lines MBL by alignment of the first and second pluralities of the potential lines VSS aligned between each of the main bit lines MBL.

Figure 9:
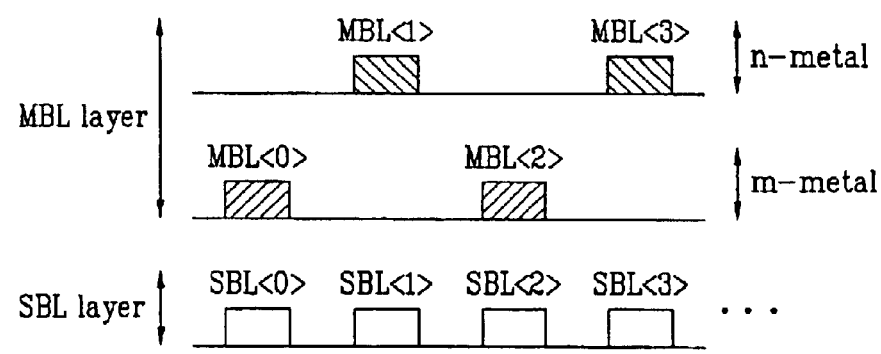
FIG. 9 is a cross-sectional view of another exemplary metal line of a nonvolatile ferroelectric memory according to the present invention.

FIG. 9 is a cross-sectional view of another exemplary metal line of a nonvolatile ferroelectric memory according to the present invention. In FIG. 9, a plurality of main bit lines MBL may be arranged into a structure similar to the structure shown in FIG. 8, but with the first and second pluralities of potential lines VSS between the main bit lines MBL being removed. Accordingly, the main bit lines MBL<0>, MBL<2>, ..., MBL<2m> on the first layer (m-metal) and the main bit lines MBL<1>, MBL<3>, ..., MBL<2n+1> on the second layer (n-metal) are directly overlying the sub-bit lines SBL<0>, SBL<1>, ..., SBL<s>. The sub-bit lines SBL<0>, SBL<1>, ..., SBL<s> may extend along the first direction and may be disposed at equal first intervals along the second direction. The main bit lines MBL<0>, MBL<2>, ..., MBL<2m> of the first layer (m-layer) and the main bit lines MBL<1>, MBL<3>, ..., MBL<2n+1> on the second layer (n-metal) may extend along the first direction and may be disposed at equal second intervals along the second direction, wherein the equal second intervals are about twice the equal first intervals. Accordingly, each of the main bit lines MBL<0>, MBL<2>, ..., MBL<2m> of the first layer (m-layer) directly overlie a first plurality of the sub-bit lines SBL<0>, SBL<2>, ..., SBL<2s>, and each of the main bit lines MBL<1>, MBL<3>, ..., MBL<2n+1> on the second layer (n-metal) directly overlie a second plurality of the sub-bit lines SBL<1>, SBL<3>, ..., SBL<2s+1>. Moreover, the main bit lines MBL<0>, MBL<2>, ..., MBL<2m> of the first layer (m-layer) and the even-numbered ones of the sub-bit lines SBL<0>, SBL<2>, ..., SBL<m> may maintain the equal third intervals, whereas the main bit lines MBL<1>, MBL<3>, ..., MBL<2n+1> on the second layer (n-metal) and the odd-numbered ones of the sub-bit lines SBL<1>, SBL<3>, ..., SBL<n> maintain equal fourth intervals that are about twice the equal third intervals. Thus, interference may be reduced due to an increase in interval spacing between adjacent main bit lines MBL. In addition, production yield may increase by reducing particle contamination between the main bit lines MBL from associated fabrication processes.

Figure 10:
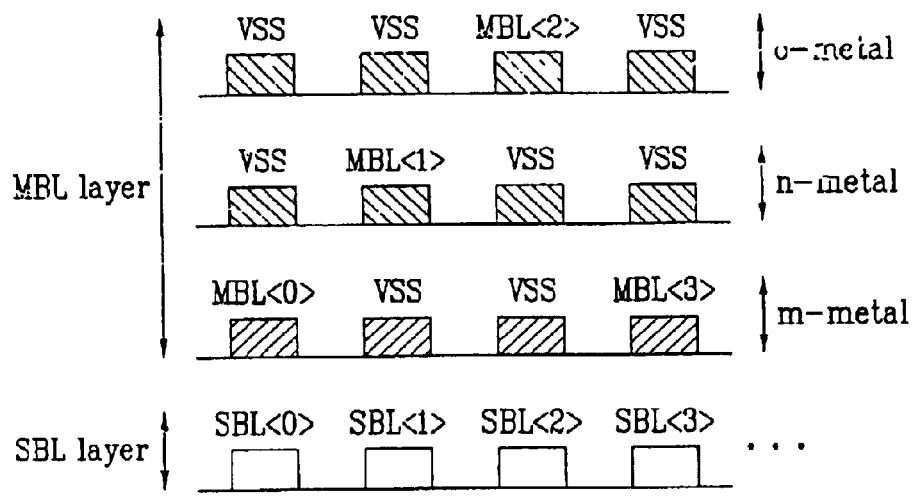
FIG. 10 is a cross-sectional view of another exemplary metal line of a nonvolatile ferroelectric memory according to the present invention.

FIG. 10 is a cross-sectional view of another exemplary metal line of a nonvolatile ferroelectric memory according to the present invention. In FIG. 10, an MBL layer that includes of a plurality of main bit lines MBL may be disposed adjacent to a SBL layer that includes a plurality of sub-bit lines, wherein the MBL layer may be arranged along a first layer (m-metal), a second layer (n-metal), and a third layer (o-metal). The first layer (m-metal layer) may include a plurality of "3m"-numbered main bit lines MBL<0>, MBL<3>, ..., MBL<3m> and a first plurality of potential lines VSS, extending along a first direction and a first plurality of potential lines VSS extending along the first direction, wherein the plurality of "3m"-numbered main bit lines MBL<0>, MBL<3>, ..., MBL<3m> and the first plurality of potential lines VSS are disposed at equal first intervals along a second direction. The second layer (n-metal layer) may include a plurality of "3n+1"-numbered main bit lines MBL<2>, MBL<4>, ..., MBL<3n+1> and a second plurality of potential lines VSS, wherein the plurality of "3n+1"-numbered main bit lines MBL<2>, MBL<4>, ..., MBL<3n+1> and the second plurality of potential lines VSS are disposed at the equal first intervals along the second direction. The third layer (o-metal layer) may include a plurality of "3o+2"-numbered main bit lines MBL<2>, MBL<4>, ..., MBL<3o+2> and a third plurality of potential lines VSS, wherein the plurality of "3o+2"-numbered main bit lines MBL<2>, MBL<4>, ..., MBL<3o+2> and the third plurality of potential lines VSS are disposed at the equal first intervals along the second direction. The plurality of "3m"-numbered main bit lines MBL<0>, MBL<3>, ..., MBL<3m> may be disposed adjacent to the SBL layer having the plurality of sub-bit lines SBL<0>, SBL<1>, ..., SBL<s>. Thus, "3m"-numbered ones of the main bit lines MBL<0>, MBL<3>, ..., MBL<3m> may directly overlie every "3s"-numbered one of the sub-bit lines SBL<0>, SBL<3>, ..., SBL<3s>, "3n+1"-numbered ones of the main bit lines MBL<1>, MBL<4>, ..., MBL<3n+1> may directly overlie every "3s+1"-numbered one of the sub-bit lines SBL<1>, SBL<4>, ..., SBL<3s+1>, and "3o+2"-numbered ones of the main bit lines MBL<2>, MBL<5>, ..., MBL<3o+2> may directly overlie every "3s+2"-numbered one of the sub-bit lines SBL<2>, SBL<5>, ..., SBL<3s+2>, wherein s=0, 1, 2, 3, ..., m, and m, n, and o=0, 1, 2, 3, ... s. Moreover, the "3m"-numbered ones of the main bit lines MBL<0>, MBL<3>, ..., MBL<3m>, the "3n+1"-numbered ones of the main bit lines MBL<1>, MBL<4>, ..., MBL<3n+1>, the "3o+2"-numbered ones of the main bit lines MBL<2>, MBL<5>, ..., MBL<3o+2>, the "3s"-numbered one of the sub-bit lines SBL<0>, SBL<3>, ..., SBL<3s>, the "3s+1"-numbered one of the sub-bit lines SBL<1>, SBL<4>, ..., SBL<3s+1>, and the "3s+2"-numbered one of the sub-bit lines SBL<2>, SBL<5>, ..., SBL<3s+2> may all be disposed at an equal second interval that is equal to the first interval. Accordingly, interference prevented by using a shield effect between main bit lines MBL by alignment of the first, second, and third pluralities of the potential lines VSS aligned between each of the main bit lines MBL.

Figure 11:
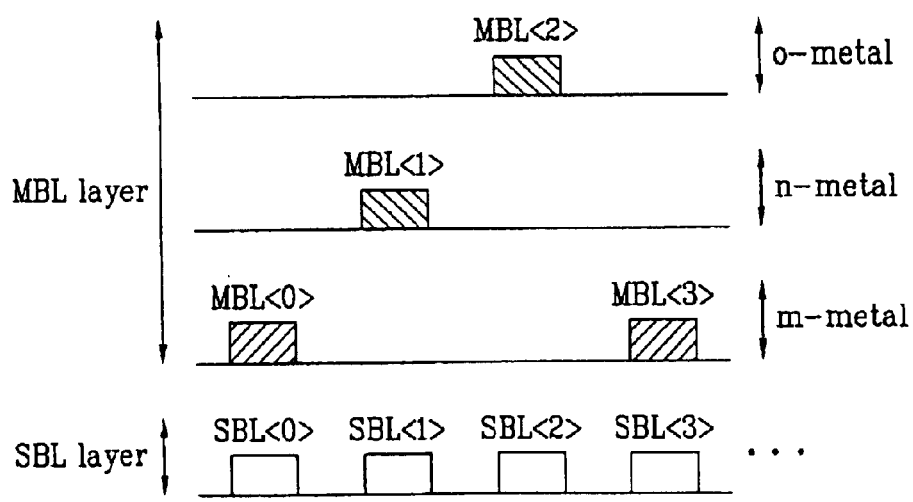
FIG. 11 is a cross-sectional view of another exemplary metal line of a nonvolatile ferroelectric memory according to the present invention.

FIG. 11 is a cross-sectional view of another exemplary metal line of a nonvolatile ferroelectric memory according to the present invention. In FIG. 11, a plurality of main bit lines MBL may be arranged into a structure similar to the structure shown in FIG. 10, but with the first, second, and third pluralities of potential lines VSS between the main bit lines MBL being removed. Accordingly, the main bit lines MBL<0>, MBL<3>, ..., MBL<3m> on the first layer (m-metal) directly overlie a first plurality of the sub-bit lines SBL<0>, SBL<3>, ..., SBL<3s>, the main bit lines MBL<1>, MBL<4>, ..., MBL<3n+1> on the second layer (n-metal) directly overlie a second plurality of the sub-bit lines SBL<1>, SBL<4>, ..., SBL<3s+1>, and the main bit lines MBL<2>, MBL<5>, ..., MBL<3o+2> on the third layer (o-metal) directly overlie a third plurality of the sub-bit lines SBL<2>, SBL<5>, ..., SBL<3o+2>. The sub-bit lines SBL<0>, SBL<1>, ..., SBL<s> may extend along the first direction and may be disposed at equal first intervals along the second direction. The main bit lines MBL<0>, MBL<3>, ..., MBL<3m> of the first layer (m-layer), the main bit lines MBL<1>, MBL<4>, ..., MBL<3n+1> on the second layer (n-metal) and the main bit lines MBL<2>, MBL<5>, ..., MBL<3o+2> on the third layer (o-metal) may extend along the first direction and may be disposed at equal third intervals along the second direction, wherein the equal third intervals are about three times the equal first intervals. Accordingly, each of the main bit lines MBL<0>, MBL<3>, ..., MBL<3m> of the first layer (m-layer) directly overlie a first plurality of the sub-bit lines SBL<0>, SBL<3>, ..., SBL<3s>, each of the main bit lines MBL<1>, MBL<3>, ..., MBL<3n+1> on the second layer (n-metal) directly overlie a second plurality of the sub-bit lines SBL<1>, SBL<4>, ..., SBL<3s+1>, and each of the main bit lines MBL<2>, MBL<5>, ..., MBL<3o+2> on the third layer (o-metal) directly overlie a third plurality of sub-bit lines SBL<2>, SBL<5>, ..., SBL<3s+2>. The main bit lines MBL<0>, MBL<3>, ..., MBL<3m> of the first layer (m-layer) and the first plurality of the sub-bit lines SBL<0>, SBL<3>, ..., SBL<3s> maintain the first equal intervals along a third direction perpendicular to the first and second directions. The main bit lines MBL<1>, MBL<4>, ..., MBL<3n+1> on the second layer (n-metal) and the second plurality of the sub-bit lines SBL<1>, SBL<4>, ..., SBL<3s+1> maintain equal fourth intervals along the third direction, wherein the equal fourth intervals are about twice the equal first intervals. The main bit lines MBL<2>, MBL<5>, ..., MBL<3o+2> on the third layer (o-metal) and the third plurality of the sub-bit lines SBL<2>, SBL<5>, ..., SBL<3o+2> maintain equal fifth intervals along the third direction, wherein the equal fifth intervals are about three times the equal first intervals and about one and one-half times the equal fourth intervals. Thus, interference may be reduced due to an increase in interval spacing between adjacent main bit lines MBL. In addition, production yield may increase by reducing particle contamination between the main bit lines MBL from associated fabrication processes.

Figure 12:
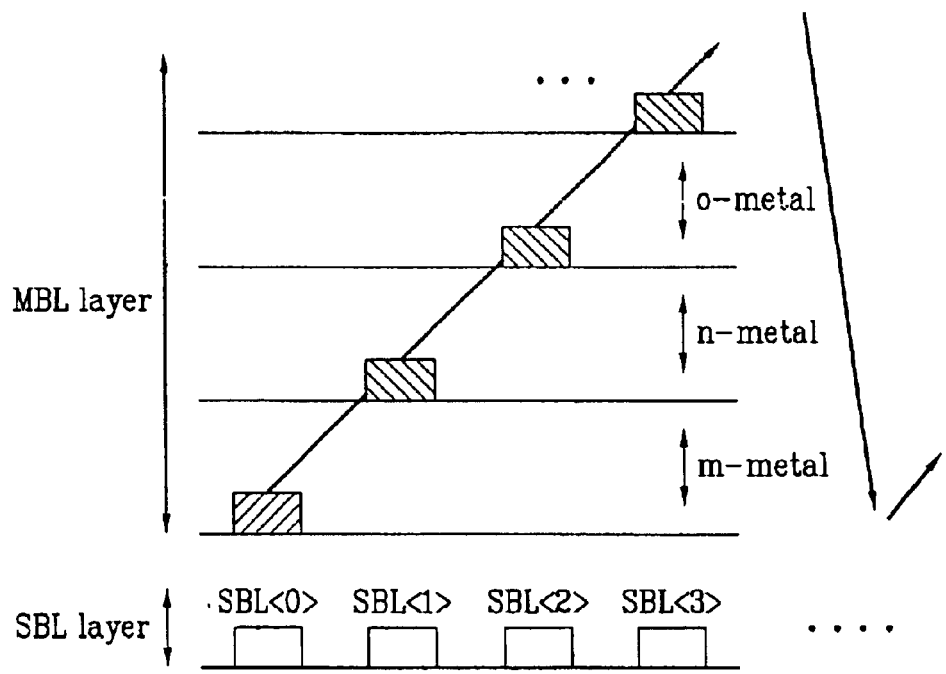
FIG. 12 is a cross-sectional view of another exemplary metal line of a nonvolatile ferroelectric memory according to the present invention.

FIG. 12 is a cross-sectional view of another exemplary metal line of a nonvolatile ferroelectric memory according to the present invention. In FIG. 12, a SBL layer having plurality of sub-bit lines SBL<0>, SBL<1>, SBL<2>, ..., SBL<s> may be formed of metal or polysilicon extending along a first direction at equal first intervals along a second direction perpendicular to the first direction, and an MBL layer having a plurality of main bit lines may be disposed in a staircase-type arrangement, wherein a plurality of metal line layers (m, n, and o) directly overlie an "s"-number of sub-bit lines extending along the first direction at the equal first intervals along the second direction. Accordingly, since the main bit lines are formed by using a plurality of metal layers, interference is reduced due to an increased interval spacing between adjacent main bit lines, and production yield increases by reducing particle contamination between the main bit lines from fabrication processes.

Figure 13:
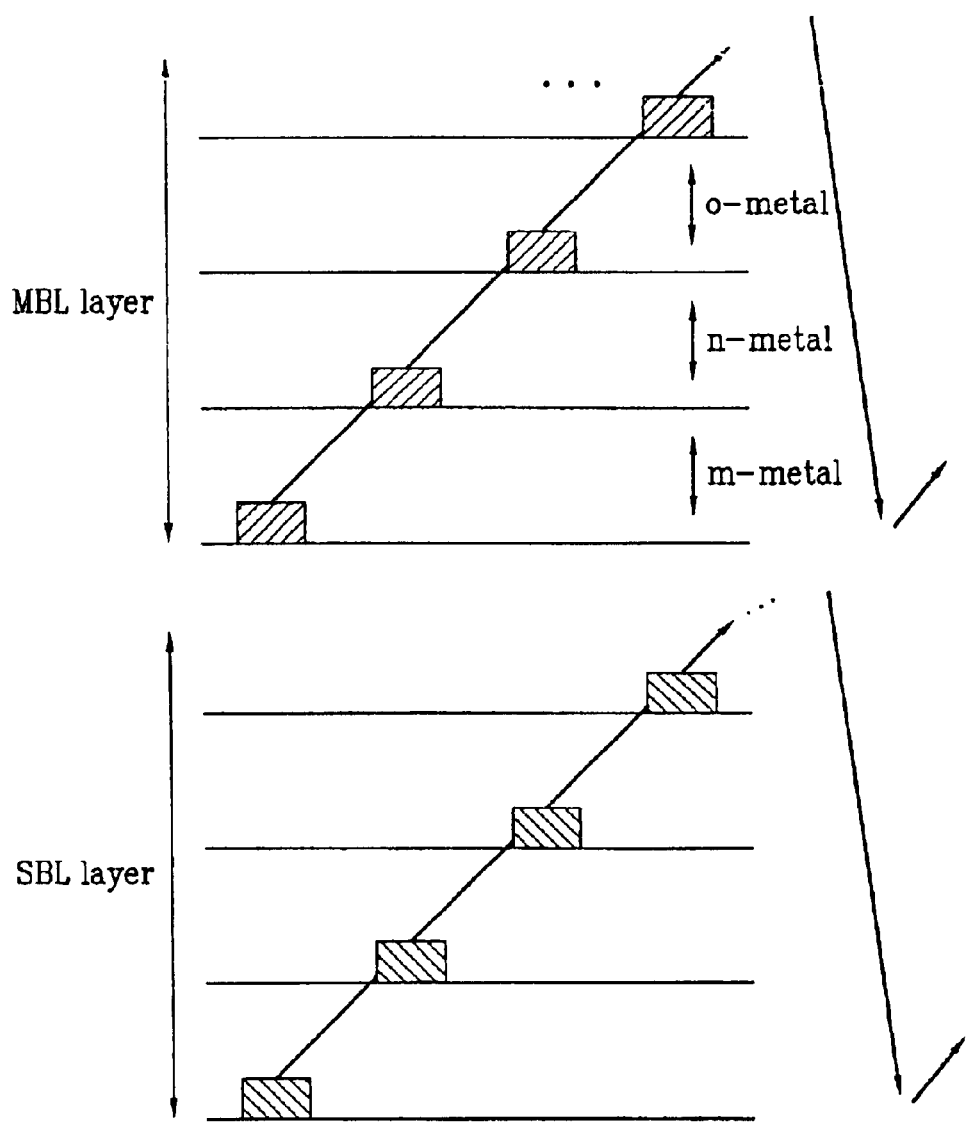
FIG. 13 is a cross-sectional view of another exemplary metal line of a nonvolatile ferroelectric memory according to the present invention.

FIG. 13 is a cross-sectional view of another exemplary metal line of a nonvolatile ferroelectric memory according to the present invention. In FIG. 13, an SBL layer may include a plurality of sub-bit lines extending along a first direction at equal first intervals along a second direction perpendicular to the first direction and at equal second intervals along a third direction perpendicular to the first and second directions in a first staircase arrangement by using a plurality of metal line layers, and an MBL layer may include a plurality of main bit lines extending along the first direction at the equal first intervals along the second direction and at the equal second intervals along the third direction in a second staircase arrangement that corresponds to the first staircase arrangement by using a plurality of metal line layers.

Figure 14:
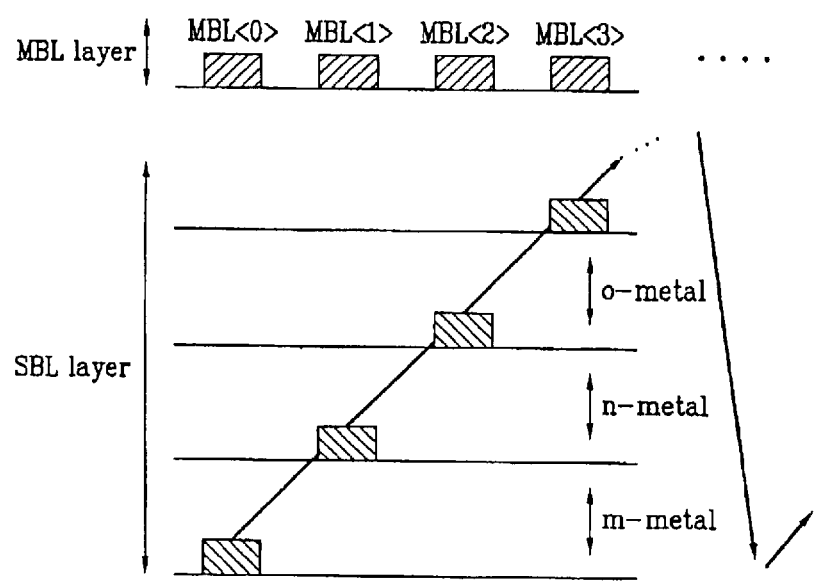
FIG. 14 is a cross-sectional view of another exemplary metal line of a nonvolatile ferroelectric memory according to the present invention.

FIG. 14 is a cross-sectional view of another exemplary metal line of a nonvolatile ferroelectric memory according to the present invention. In FIG. 14, an SBL layer may include a plurality of sub-bit lines extending along a first direction at equal first intervals along a second direction perpendicular to the first direction and at equal second intervals along a third direction perpendicular to the first and second directions in a first staircase arrangement by using a plurality of metal line layers. An MBL layer may include a plurality of main bit lines MBL<0>, MBL<1>, ..., MBL<s> extending along the first direction at the equal first intervals along the second direction, wherein the equal first and second intervals are about the same. Accordingly, each of the sub-bit lines of the SBL layer may directly overlie to be aligned with the plurality of main bit lines MBL<0>, MBL<1>, ..., MBL<s> of the MBL layer.

In general, as a distance between adjacent bit lines decreases, a cross-talk capacitance increases and a bit line sensing margin decreases. Accordingly, as a sensing voltage decreases to about 30% to 40%, the bit line sensing margin increases. As an interval between adjacent bit lines doubles, the sensing margin is reduced by 15% to 20%. Likewise, as an interval between adjacent bit lines triples, the sensing margin is reduced by 7.5% to 10%. Accordingly, sub-bit lines may not be used for a plurality of metal bit lines since they occupy about 30% of an overall bit line capacitance. Meanwhile, a plurality of main bit lines may occupy about 70% of the overall bit line capacitance and may be used for a plurality of metal lines in order to reduce the cross-talk capacitance.

It will be apparent to those skilled in the art than various modifications and variations can be made in the metal line of a nonvolatile ferroelectric memory of the present invention. Thus, it is intended that the present invention covers the modifications and variations of this invention provided they come within the scope of the appended claims and their equivalents.

What is claimed is:

1. A nonvolatile ferroelectric memory device, comprising:
 a plurality of top array blocks disposed along a first direction, each having a plurality of top sub-cell array blocks disposed along a second direction perpendicular to the first direction, each of the top sub-cell array blocks including a first plurality of unit cells;
 a plurality of bottom array blocks disposed along the first direction below the plurality of top array blocks, each having a plurality of bottom sub-cell array blocks disposed along the second direction, each of the bottom sub-cell array blocks including a second plurality of unit cells;
 a plurality of sub-bit lines extending along the second direction and disposed at equal first intervals along the first direction, each sub-bit line connected to at least a first end of one of the first and second pluralities of unit cells; and
 a plurality of main bit lines extending along the second direction and disposed at the equal first intervals along a third direction perpendicular to both the first and second directions, said main bit lines being formed in a plurality of layers that are disposed on a plurality of parallel planes.

2. The device according to claim 1, wherein each of the main bit lines are disposed at equal second intervals along the first direction.

3. The device according to claim 1, wherein the main bit lines are disposed on at least three parallel planes.

4. The device according to claim 2, wherein the sub-bit lines are disposed at the equal second intervals along the first direction.

5. The device according to claim 1, wherein the sub-bit lines are disposed at the equal second intervals along the third direction.

6. The device according to claim 5, wherein the sub-bit lines are disposed on a plurality of parallel planes.

7. The device according to claim 6, wherein the sub-bit lines are disposed on at least three parallel planes.

8. The device according to claim 1, wherein each of the main bit lines directly overlies one of the sub-bit lines.

9. The device according to claim 1, further comprising a plurality of metal lines alternatingly disposed on at least one of said plurality of main bit line layers between main bit lines of said at least one layer.

10. The device according to claim 9, wherein the metal lines are electrically grounded.

11. The device according to claim 1, wherein each cell array block comprises:
 a plurality of pairs of split word lines connected to each of the sub-bit lines;
 a first plurality and a second plurality of supply lines extending along the second direction and connected to each of the top and bottom sub-cell array blocks; and
 a plurality of switching control blocks driven by the supply lines.

12. The device according to claim 11, wherein each switching control block comprises:
 a first transistor having a gate connected to one of the first plurality of supply lines, a first source/drain connected to one of the sub-bit lines, and a second source/drain connected to a power supply; and
 a second transistor having a gate connected to one of the second plurality of supply lines, a third source/drain connected to the first source/drain of the first transistor, and a fourth source/drain connected to one of the plurality of main bit lines.

13. The device according to claim 11, wherein each switching control block comprises:
- a first transistor having a gate connected to one of the first plurality of supply lines, a first source/drain connected to one of the sub-bit lines, and a second source/drain connected to a power supply;
- a second transistor having a gate connected to one of the second plurality of supply lines, a third source/drain connected to the first source/drain of the first transistor, and a fourth source/drain connected to one of the plurality of main bit lines; and
- a third transistor having a gate connected to one of a third plurality of supply lines extending along the second direction SBPU supply line, a fifth source/drain connected to the third source/ drain of the second transistor and the first source/drain of the first transistor, and a sixth source/drain connected to electrical ground.

14. The device according to claim 1, wherein each of the top and bottom array blocks include a plurality of word line and plate line pairs extending along the second direction, and a plurality of switching control blocks enabled by a bit line switching supply line and electrically interconnected between one of the plurality of sub-bit lines and one of the plurality of main bit lines.

15. A method of fabricating a nonvolatile ferroelectric memory device, comprising steps of:
- forming a plurality of top array blocks disposed along a first direction, each having a plurality of top sub-cell array blocks disposed along a second direction perpendicular to the first direction, each of the top sub-cell array blocks including a first plurality of unit cells;
- forming a plurality of bottom array blocks disposed along the first direction below the plurality of top array blocks, each having a plurality of bottom sub-cell array blocks disposed along the second direction, each of the bottom sub-cell array blocks including a second plurality of unit cells;
- forming a plurality of sub-bit lines extending along the second direction and disposed at equal first intervals along the first direction, each sub-bit line connected to at least a first end of one of the first and second pluralities of unit cells; and
- forming a plurality of main bit lines extending along the second direction and disposed at the equal first intervals along a third direction perpendicular to both the first and second directions, said main bit lines being formed in a plurality of layers that are disposed on a plurality of parallel planes.

16. The method according to claim 15, wherein each of the main bit lines are formed at equal second intervals along the first direction.

17. The method according to claim 15, wherein the main bit lines are formed on at least three parallel planes.

18. The method according to claim 16, wherein the sub-bit lines are formed at the equal second intervals along the first direction.

19. The method according to claim 15, wherein the sub-bit lines are formed at the equal second intervals along the third direction.

20. The method according to claim 19, wherein the sub-bit lines are formed on a plurality of parallel planes.

21. The method according to claim 20, wherein the sub-bit lines are formed on at least three parallel planes.

22. The method according to claim 15, wherein each of the main bit lines are formed to directly overlie one of the sub-bit lines.

23. The method according to claim 15, further comprising the step of forming a plurality of metal lines between the plurality of main bit lines.

24. A nonvolatile ferroelectric memory device, comprising:
- a plurality of top array blocks disposed along a first direction, each having a plurality of top sub-cell array blocks disposed along a second direction perpendicular to the first direction, each of the top sub-cell array blocks including a first plurality of unit cells;
- a plurality of bottom array blocks disposed along the first direction below the plurality of top array blocks, each having a plurality of bottom sub-cell array blocks disposed along the second direction, each of the bottom sub-cell array blocks including a second plurality of unit cells;
- a plurality of sub-bit lines extending along the second direction and disposed at equal first intervals along the first direction, each sub-bit line connected to at least a first end of one of the first and second pluralities of unit cells;
- a plurality of main bit lines extending along the second direction and disposed at the equal first intervals along a third direction perpendicular to both the first and second directions;
- each cell array block including,
    - a plurality of pairs of split word lines connected to each of the sub-bit lines;
    - a first plurality and a second plurality of supply lines extending along the second direction and connected to each of the top and bottom sub-cell array blocks; and
    - a plurality of switching control blocks driven by the supply lines, each switching control block including,
        - a first transistor having a gate connected to one of the first plurality of supply lines, a first source/drain connected to one of the sub-bit lines, and a second source/drain connected to a power supply; and
        - a second transistor having a gate connected to one of the second plurality of supply lines, a third source/drain connected to the first source/drain of the first transistor, and a fourth source/drain connected to one of the plurality of main bit lines.

25. A method of fabricating a nonvolatile ferroelectric memory device, comprising steps of:
- forming a plurality of top array blocks disposed along a first direction, each having a plurality of top sub-cell array blocks disposed along a second direction perpendicular to the first direction, each of the top sub-cell array blocks including a first plurality of unit cells;
- forming a plurality of bottom array blocks disposed along the first direction below the plurality of top array blocks, each having a plurality of bottom sub-cell array blocks disposed along the second direction, each of the bottom sub-cell array blocks including a second plurality of unit cells;
- forming a plurality of sub-bit lines extending along the second direction and disposed at equal first intervals along the first direction, each sub-bit line connected to at least a first end of one of the first and second pluralities of unit cells;
- forming a plurality of main bit lines extending along the second direction and disposed at the equal first intervals along a third direction perpendicular to both the first and second directions; and
- forming a plurality of metal lines between the plurality of main bit lines.

* * * * *